(12) United States Patent
Burns et al.

(10) Patent No.: US 7,422,107 B2
(45) Date of Patent: Sep. 9, 2008

(54) KINEMATIC COUPLING WITH TEXTURED CONTACT SURFACES

(75) Inventors: John Burns, Colorado Springs, CO (US); Martin L. Forbes, Divide, CO (US); Matthew A. Fuller, Colorado Springs, CO (US); Jeffery J. King, Colorado Springs, CO (US); Mark V. Smith, Colorado Springs, CO (US)

(73) Assignee: Entegris, Inc., Chaska, MN (US)

( * ) Notice: Subject to any disclaimer, the term of this patent is extended or adjusted under 35 U.S.C. 154(b) by 410 days.

(21) Appl. No.: 11/339,462

(22) Filed: Jan. 25, 2006

(65) Prior Publication Data

US 2007/0170089 A1   Jul. 26, 2007

(51) Int. Cl.
*B65D 85/86* (2006.01)

(52) U.S. Cl. ............ 206/454; 206/710; 118/500; 414/940

(58) Field of Classification Search ............ 206/454, 206/710, 711, 712, 1.5; 118/500; 29/464, 29/466, 281.5; 211/41.18; 414/935, 940
See application file for complete search history.

(56) References Cited

U.S. PATENT DOCUMENTS

| | | | |
|---|---|---|---|
| 4,314,559 A | 2/1982 | Allen | |
| 4,960,195 A | 10/1990 | Yamaguchi et al. | |
| 5,024,126 A | 6/1991 | Holland-Letz et al. | |
| 5,678,944 A | 10/1997 | Slocum et al. | |
| 5,679,436 A | 10/1997 | Zhao | |
| 5,769,554 A * | 6/1998 | Slocum ............... | 403/13 |
| 6,164,664 A | 12/2000 | Fosnight et al. | |
| 6,520,338 B2 | 2/2003 | Bores et al. | |
| RE38,221 E | 8/2003 | Gregerson et al. | |
| 6,851,170 B2 | 2/2005 | Lappen et al. | |
| 2002/0036051 A1 | 3/2002 | Rajala et al. | |
| 2003/0029765 A1 | 2/2003 | Bhatt et al. | |
| 2003/0086748 A1 * | 5/2003 | Culpepper ............... | 403/13 |
| 2003/0110611 A1 | 6/2003 | Lappen et al. | |
| 2003/0188990 A1 * | 10/2003 | Bhatt et al. ............... | 206/710 |

FOREIGN PATENT DOCUMENTS

| | | |
|---|---|---|
| EP | 0857150 B1 | 3/2002 |
| WO | WO 2005/047117 A2 | 5/2005 |

OTHER PUBLICATIONS

Semi, *Semi E57-0299, Provisional Mechanical Specification for Kinematic Couplings Used to Align and Support 300 mm Wafer Carriers*, Semi 1996, pp. 1-8.

\* cited by examiner

*Primary Examiner*—Jacob K Ackun, Jr.
(74) *Attorney, Agent, or Firm*—Patterson, Thuente, Skaar & Christensen, P.A.

(57) ABSTRACT

A substrate kinematic coupling or guide plate for a substrate carrier having textured or patterned surfaces at the points of contact to reduce frictional forces generated between automated processing equipment and the kinematic coupling. The textured surface reduces the contact area between the processing equipment and the contact portion of the kinematic coupling, thereby reducing the resultant frictional force. By reducing the frictional force, the substrate carrier more readily settles on the mounting pins of the processing equipment, thus avoiding intolerable height and angular deviations during automated access to the substrates. Textures include, but are not limited to, a knurl pattern, ridges running laterally along the contact portions, and ridges running longitudinally along the contact portions. The textures may be formed by a blow molding, injection molding or in an overmolding process, or by a machining or imprinting process.

16 Claims, 7 Drawing Sheets

KINEMATIC COUPLING WITH TEXTURED CONTACT SURFACES

BACKGROUND OF THE INVENTION

This invention relates to semiconductor processing equipment. More specifically, it relates to kinematic coupling of substrate carriers to processing equipment.

Generally, substrate carriers, for example, 300 mm wafer containers, known as FOUPS (acronym for front opening unified pod) and FOSBS (acronym for front opening shipping container) include a downward facing equipment interface portion, such as a guide plate, that has a kinematic coupling, for properly orienting the carrier with respect to carrier interface portions provided by the processing equipment. The configuration of the equipment interface portions are typically dictated by industry standards promulgated by the Semiconductor Equipment and Materials International (SEMI). For 300 mm wafer containers the equipment interface located on the bottom of the containers are known as kinematic couplings. Other equipment interfaces may also exist on substrate carriers. Some substrate carriers have equipment interface structures 10 configured as the kinematic couplings that are integrated into the same mold as a container portion of the carrier. Other substrate carriers utilize a mounting plate 20 that is molded apart from and subsequently attached to a carrier, as shown in FIG. 2. Still other substrate carriers, such as those depicted in U.S. Pat. No. 6,520,338, which is hereby incorporated by reference, utilize a guide plate 30, as shown in FIG. 3, to center contact of the processing equipment onto partitions that extend directly from the exterior surface of the substrate carrier. The portions of the structure that interface with the external processing equipment can be molded integrally with the mounting plate or guide plate, overmolded onto a base structure, or formed separately and attached to the base structure.

Typically, a guide plate or kinematic coupling plate will have a trio of grooves with inclined walls arranged equilaterally about a central axis, with the apex axis of each groove oriented to intersect with the central axis. The process equipment typically engages the inclined surfaces of the groove with mounting pins to provide a stable three-point mount.

The purpose of the kinematic couplings is to provide a stable and repeatable means of positioning the carrier and the substrates within the carrier at a predetermined height for robotic manipulation. If the carrier is not located at a tolerable height or orientation with respect to the processing equipment, the robotic manipulators may malfunction, causing delays in the assembly line as well as damage to the substrates or carrier. A common problem encountered with the kinematic couplings is that the interface portions will sometimes frictionally adhere or "stick" to the contacting surfaces of the processing equipment. If the sticking occurs before the carrier is stably seated on the mounting pins, the carrier may "hang up" and remain at an unacceptable height, or cause the carrier to list at an intolerable angle with respect to the robotic manipulators. Also, as the robotic manipulators begin to handle the substrates, the carrier may suddenly slip off the stick point, causing the carrier to lurch downward and causing a risk of damaging contact between the robotic manipulators and the substrates.

SUMMARY OF THE INVENTION

The present invention addresses the problem of sticking by providing a three-dimensional texture or pattern on contacting surfaces of equipment interface portions. The textured or patterned surface provides less contact area than a flat surface, thus reducing the frictional forces that cause sticking.

Specifically, particular embodiments of the present invention include a kinematic coupling plate for a substrate carrier that has a base or support structure with three cavities or recesses defined therein, and with a three-dimensional texture formed on the surfaces defining the cavity. For example, a kinematic coupling plate for a substrate carrier that has a support structure with an aperture formed thereon, an engagement portion depending from the perimeter of the aperture that is curved or inclined with respect to a face of the support structure, and with a texture or pattern formed on the engagement portion. The engagement portion may be formed integral to the support structure, or formed separately and attached to the support structure. The texture may take the form of a knurl, a series of parallel ridges, or any other three-dimensional profile capable of being formed as part of a surface. The engagement portion may take on the form of either a concavity or a convexity relative to the face of the support structure. The support structure may be included as part of a substrate carrier, either formed integrally therewith or separably attached to the container portion.

DETAILED SPECIFICATION

Figure 1:
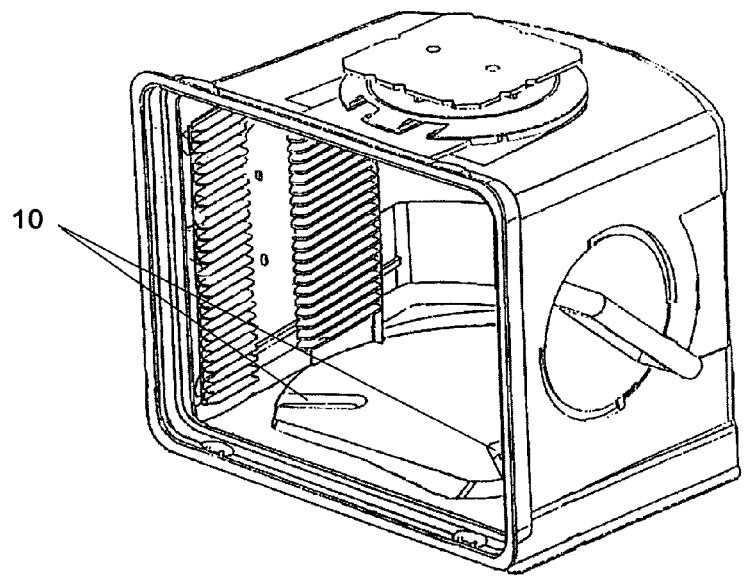
FIG. 1 is a perspective view of a substrate carrier with kinematic coupling grooves integral to a base portion of the carrier, according to the prior art.
Figure 2:
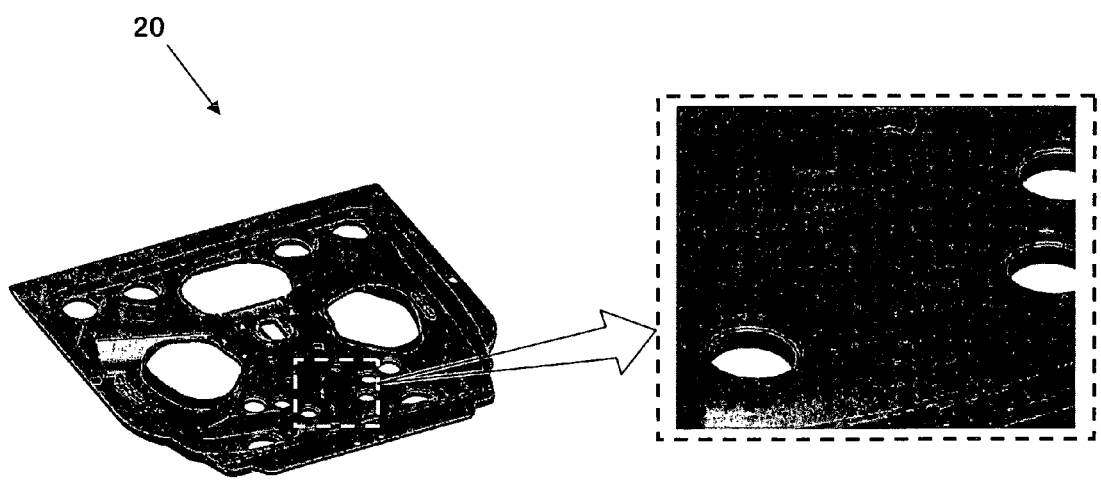
FIG. 2 shows a mounting plate for mounting on the bottom of a wafer carrier, according to the prior art.
Figure 3:
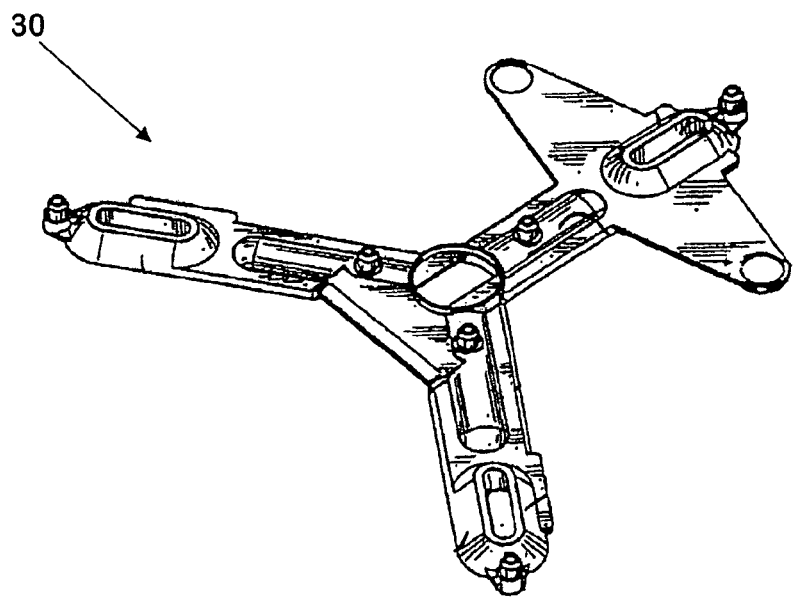
FIG. 3 shows a guide plate for mounting on the bottom of a wafer carrier, according to the prior art.

Referring to FIGS. 4*a*, 4*b*, and 4*c*, 300 mm wafer containers 31, 32 and an embodiment of an interface portion 40 of a kinematic coupling plate 50 according to the present invention are illustrated. The container of FIG. 4*a* has a container portion 33, a door 34, side handles 35, equipment interfaces configured as female kinematic coupling grooves 36, shown in phantom lines, side rails 37, a robotic flange 38, and key slots 39. The container seats on equipment 39.5 that has carrier interfaces, not shown in this view. Each of the equipment interfaces may have textured contact surfaces 39.6 as described in more detail below where the equipment interfaces may engage or contact the external equipment. Such equipment may be the keys for operating latching mechanisms, forks for engaging side rails, and robotic grasping members for grasping robotic flanges.

Figure 4C:
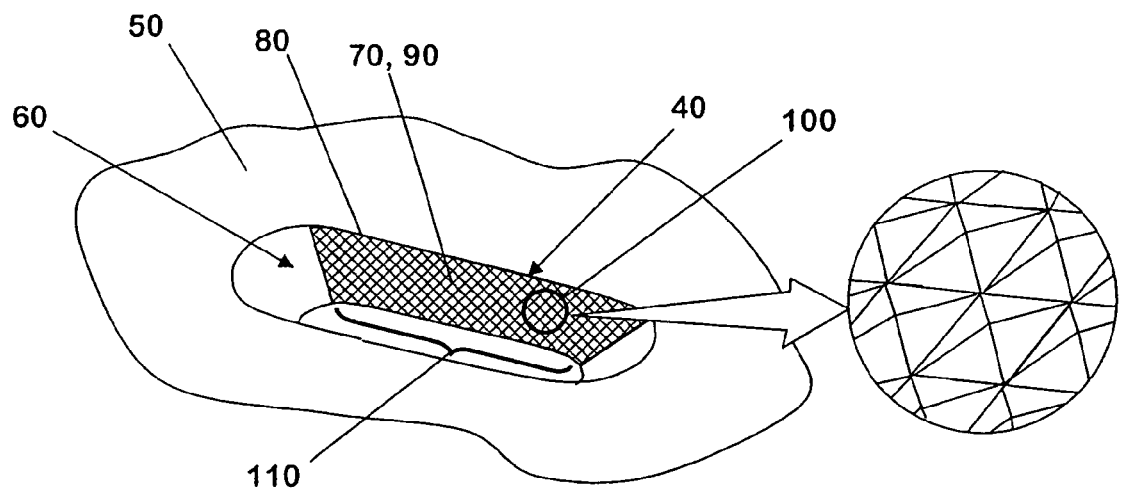
FIG. 4*c* is an isometric view of a kinematic coupling groove of the present invention.
Figure 4A:
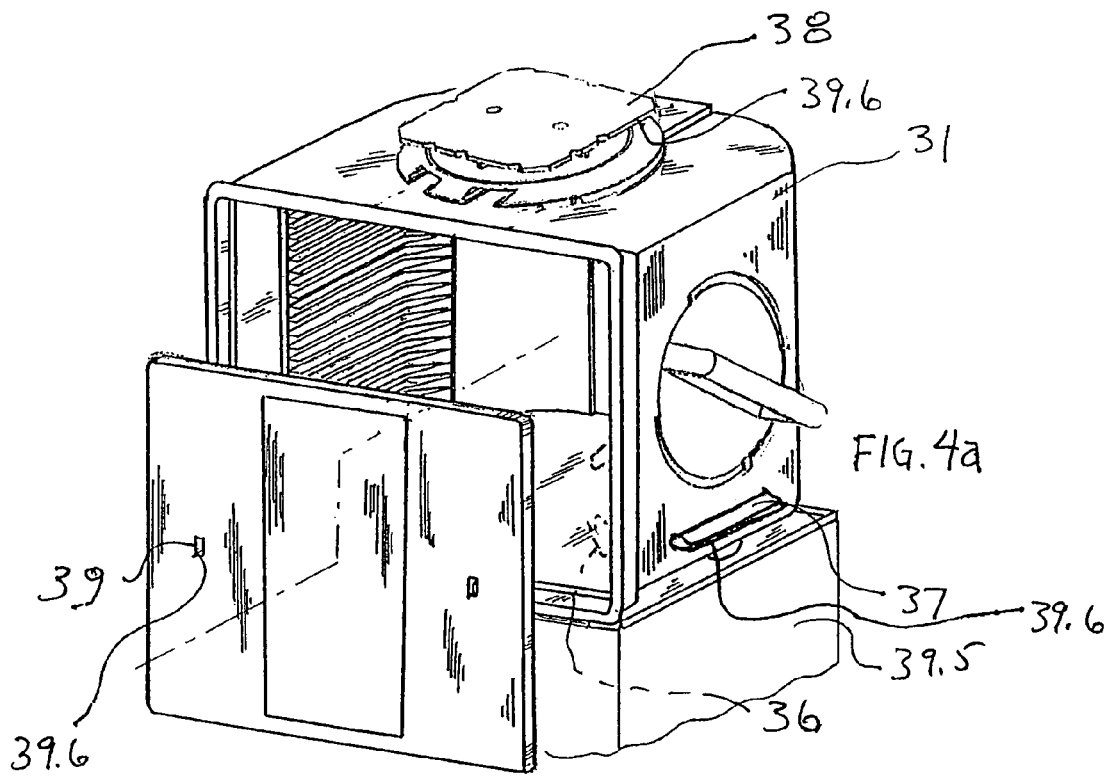
FIG. 4*a* is a perspective view of a 300 mm wafer container according to the invention.
Figure 4B:
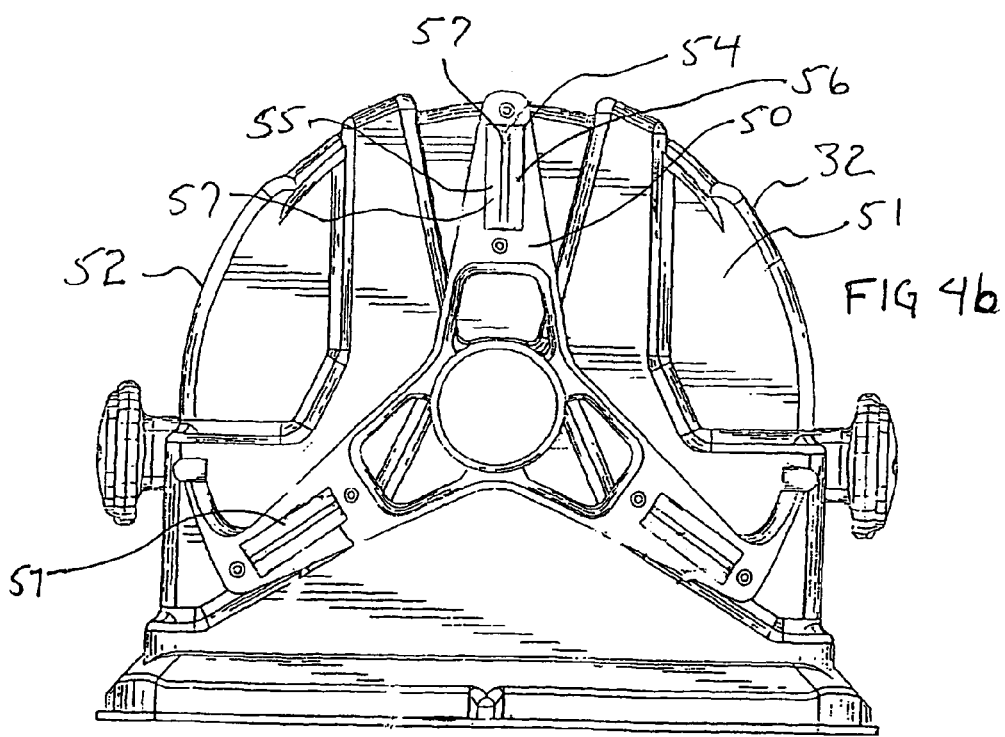
FIG. 4*b* is a bottom view of a 300 mm wafer container according to the invention

FIG. 4b illustrates a 300 mm wafer container with a kinematic coupling plate 50 affixed to the bottom side 51 of the container portion 52. The plate has three female kinematic coupling portions 54 each with opposing surfaces 55, 56 angled from the horizontal defining a recess 57. The opposing kinematic coupling surfaces 55, 56 have textured contact surfaces 57 that contact male kinematic coupling projections described below. Such container is disclosed in more detail in U.S. Pat. No. RE 38,221, owned by the owner of the instant invention and incorporated herein by reference.

Referring to FIG. 4c, the interface portion 40 is defined by an aperture or recess 60 of oblong shape with an inclined surface 70 extending from the perimeter 80 of the aperture 60. A textured or patterned surface 90 having a generally knurled or pyramidal profile 100 is formed on contact portions 110 of the inclined surface 70 that make contact with external processing equipment. The textured surface 90 may be formed in the molding process, machined or thermally imprinted on the surface after the molding process, or formed by other means.

Figure 5:
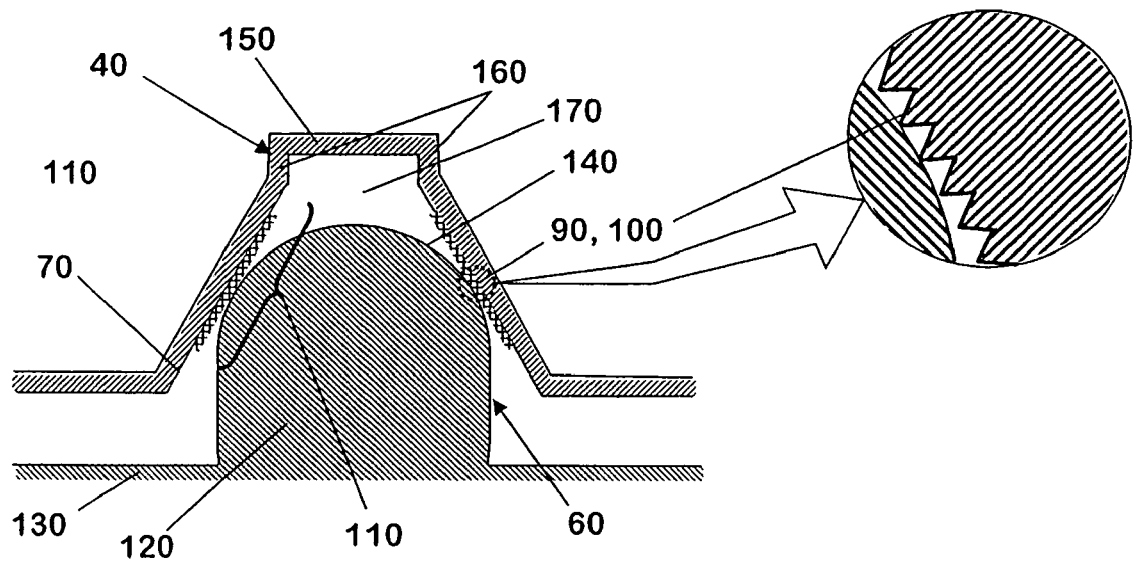
FIG. 5 is a cross-sectional view of a kinematic coupling groove of the present invention.

Referring to FIG. 5, the interface portion 40 of FIG. 4 is shown in cross-section. A male kinematic projection 120, typically a rounded solid projection, extends from a equipment or a processing apparatus 130 through the aperture 60 and engages the inclined textured surface 70 of the interface portion 40. The knurled pattern 100, shown in cross-section in the inset, reduces contact between the kinematic coupling pin 120 and the interface portion 40 to discrete points of contact. Because the tendency of two bodies to stick together is proportional to the common contact area, a reduction of the area to points of contact substantially reduces the sticking tendency between the two bodies. Accordingly, the presence of the textured or patterned surface 90 allows the mounting pin 120 to slide along the proud points of the pyramidal profile 100 without sticking or otherwise hanging up, until both sides of the mounting pin 120 are in contact with the interface portion 40.

Performance of the interface portion 40 is enhanced if the surface 140 of the mounting pin 120 is smooth. If the surface 140 of the mounting pin 120 is also patterned or otherwise roughened, the surface 140 will tend to mate or intermesh with the contact portions 110 and may actually exacerbate the problems of sticking and hang up. Semiconductor Equipment and Materials International (SEMI), a global trade association that maintains standards for the semiconductor industry, has specified that the average roughness $R_a$ (defined below) of the surface 140 be $0.3 \times 10^{-6}$-meters (0.3-um) or less. (See SEMI standard E57, Tables 1 and 2, available from SEMI Global Headquarters, 3081 Zanker Road, San Jose, Calif. 95134.) Accordingly, the textured or patterned surface 120 should be considerably greater than the roughness $R_a$ of the surface 140 of the mounting pin 120. It is believed that if the roughness of the textured or patterned surface 120 is over is over ten times the roughness of the surface 140 of the mounting pin 120, the performance of the interface portion 40 will be enhanced according to the present invention. Hence, a minimum roughness $R_a$ of greater than 3-μm is established for the surface 140 of the mounting pin 120.

Figure 6:
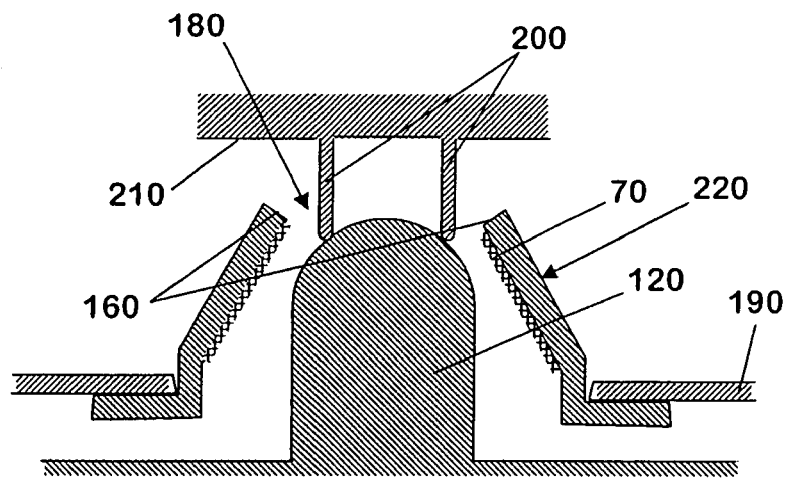
FIG. 6 is a cross-sectional view of a kinematic coupling groove for a guide plate according to the present invention.
Figure 7:
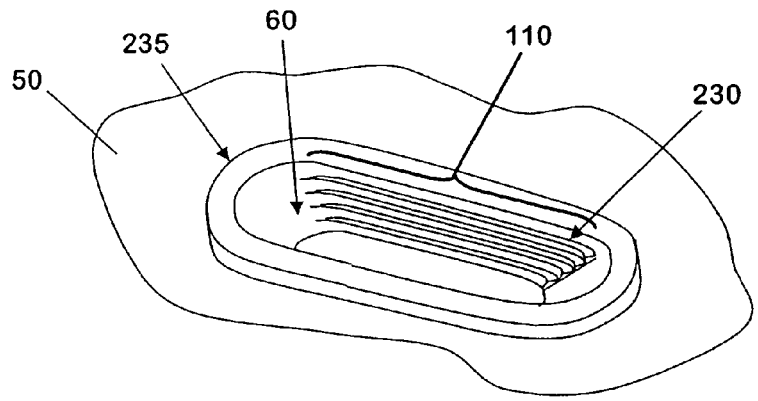
FIG. 7 is an isometric view of a kinematic coupling groove of the present invention.
Figure 8:
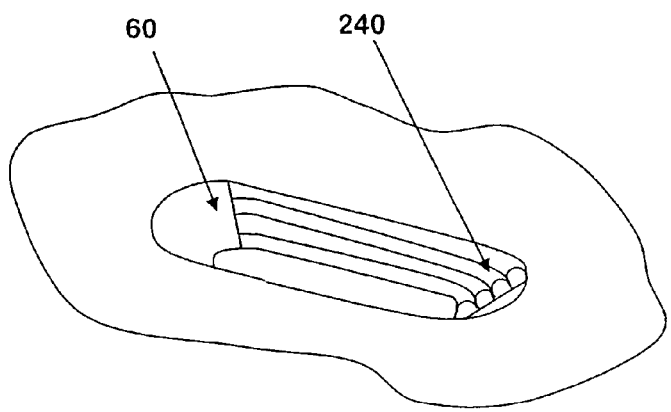
FIG. 8 is an isometric view of a kinematic coupling groove of the present invention.
Figure 9:
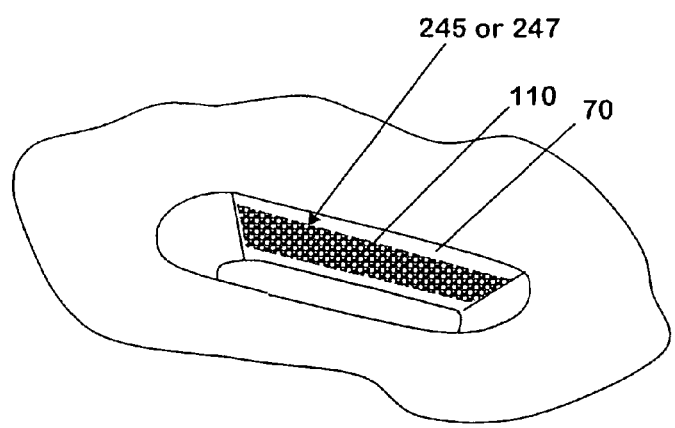
FIG. 9 is an isometric view of a kinematic coupling groove of the present invention.

Note that the embodiment of FIG. 5 shows a cap portion 150 that depends from a distal end portion 160 of the inclined surface 70, thereby creating a cavity 170. Referring to FIG. 6, an embodiment is shown wherein there is no cap portion, thus forming a second aperture 180 defined by the distal end portion 160 of the inclined surface 70. The FIG. 6 embodiment is suitable for implementation with a guide plate 190, wherein stable engagement of the mounting pin 120 is with a pair of partitions 200 that extend from the bottom surface of a substrate carrier 210. Hence, the textured or patterned surface of FIG. 6 serves to inhibit the mounting pin 120 from sticking to the inclined surface 70, but does not remain in contact with the mounting pin 120 when the substrate carrier is at rest. The embodiment of FIG. 6 also shows an interface portion 220 that was formed separately from the guide plate 190 and press fit or otherwise attached to the guide plate 190.

Figure 10:
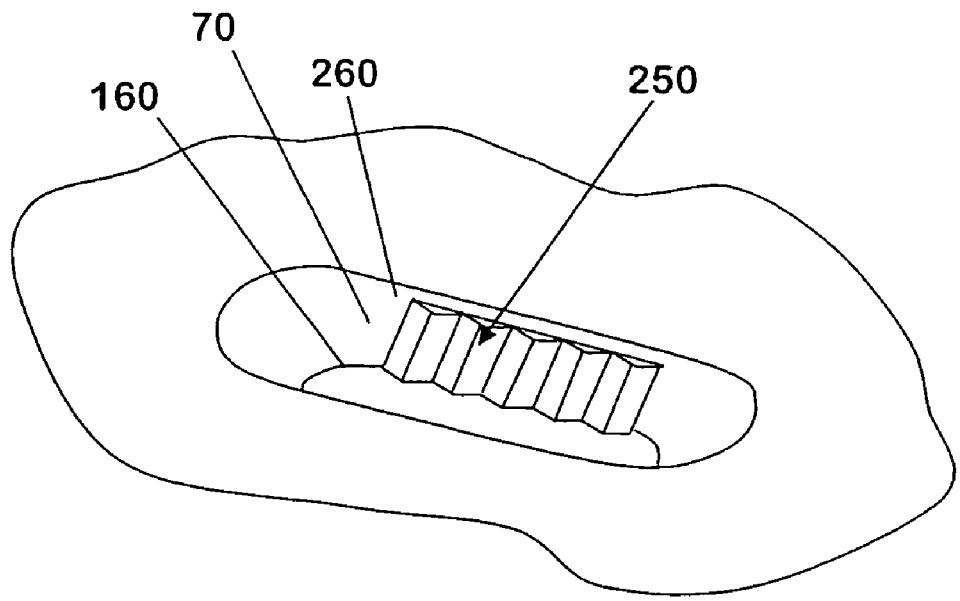
FIG. 10 is an isometric view of a kinematic coupling groove of the present invention. The scale of the peaks extending from the surface is exaggerated.

Referring to FIGS. 7-10, other textured or patterned surfaces besides the knurled surface may be implemented in the present invention. The embodiment of FIG. 7 utilizes raised ridges of generally triangular shape 230 that run substantially parallel to the aperture 60, thus creating line contact between the contact portion 110 and external processing equipment. The FIG. 7 embodiment also shows an interface portion 235 that was formed apart from the kinematic coupling plate 50 and subsequently attached to the kinematic coupling plate 50. The embodiment depicted in FIG. 8 features rounded ridges 240 that also run substantially parallel to the aperture 60. The FIG. 9 embodiment illustrates a dimpled pattern 245 formed on the contact portion 110. The dimples are convex with respect to the inclined surface 70. Conversely, a pattern of arrayed spherical protrusions 247 depending from the inclined surface 70 could also be implemented. The embodiment of FIG. 10 shows triangular ridges that run longitudinally 250 along the inclined surface 70, i.e. from a proximate end 260 to the distal end 160 of the inclined surface 70.

The aforementioned patterns or textures are provided by way of example, and are not to be construed as limiting the present invention.

In application, one skilled in the art of surface texturing or profiling would select an appropriate profile so as to allow free movement of the processing equipment not only along the slope of the inclined surface, but also laterally across the contact surface. Generally, any surface texture or pattern having an average surface roughness $R_a$ greater than 0.05-millimeters (mm) (0.002-in.), will promote the non-sticking behavior of the present invention. "Average surface roughness" $R_a$ is a widely recognized surface parametric, defined by the equation $$R_a = \frac{1}{L} \int_0^L |r(x)| dx$$

where r(x) is a height measurement at a position x of the surface being characterized, and L is the length over which the surface is being evaluated.

Still another parameter that characterizes surface profiles is the "waviness." Waviness is an indication of a more macroscopic or widely spaced repetitive deviation from a flat surface. For example, a peak waviness $W_P$ the maximum height of a profiled surface above an average surface height. By definition, there is a maximum depth of the same profiled surface, referred to as $W_V$, that is numerically the same as $W_P$. The reader is referred to the Appendix for more details on roughness and waviness.

Figure 11:
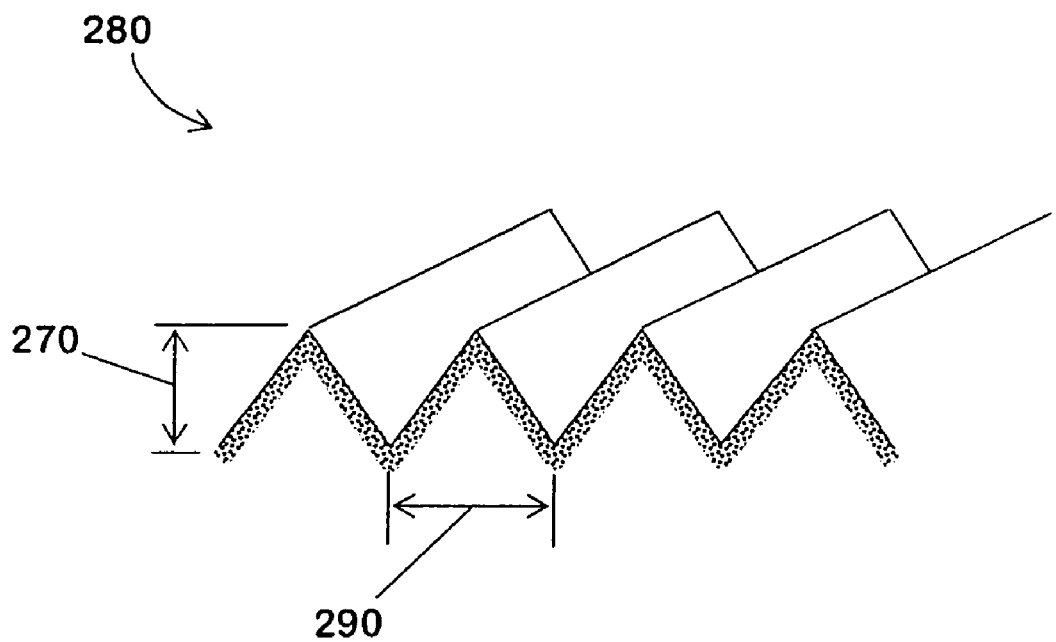
FIG. 11 depicts a kinematic coupling member according to the present invention.

Referring to FIG. 11, another way to characterize surface profiles for the present invention is to establish a maximum peak-to-valley depth 270 of the profile. This method is particularly appropriate where a repetitive three-dimensional pattern 280 is imposed on a surface. For instance, machinists have long characterized knurl patterns in this way. A representative texture for the embodiment shown in FIG. 4, for example, is referred to as in the industry as a medium knurl of approximately 0.5-mm (0.020-in.) depth, meaning the peak-to-valley depth 270 is 0.5-mm. A lateral spacing 290 between the peak and valley may also be provided. A ratio of the peak-to-valley depth 270 to the lateral spacing 290 is referred to as the "aspect ratio." A wide range of depths, aspect ratios and geometries may be effectively implemented in the present invention.

Figure 12:
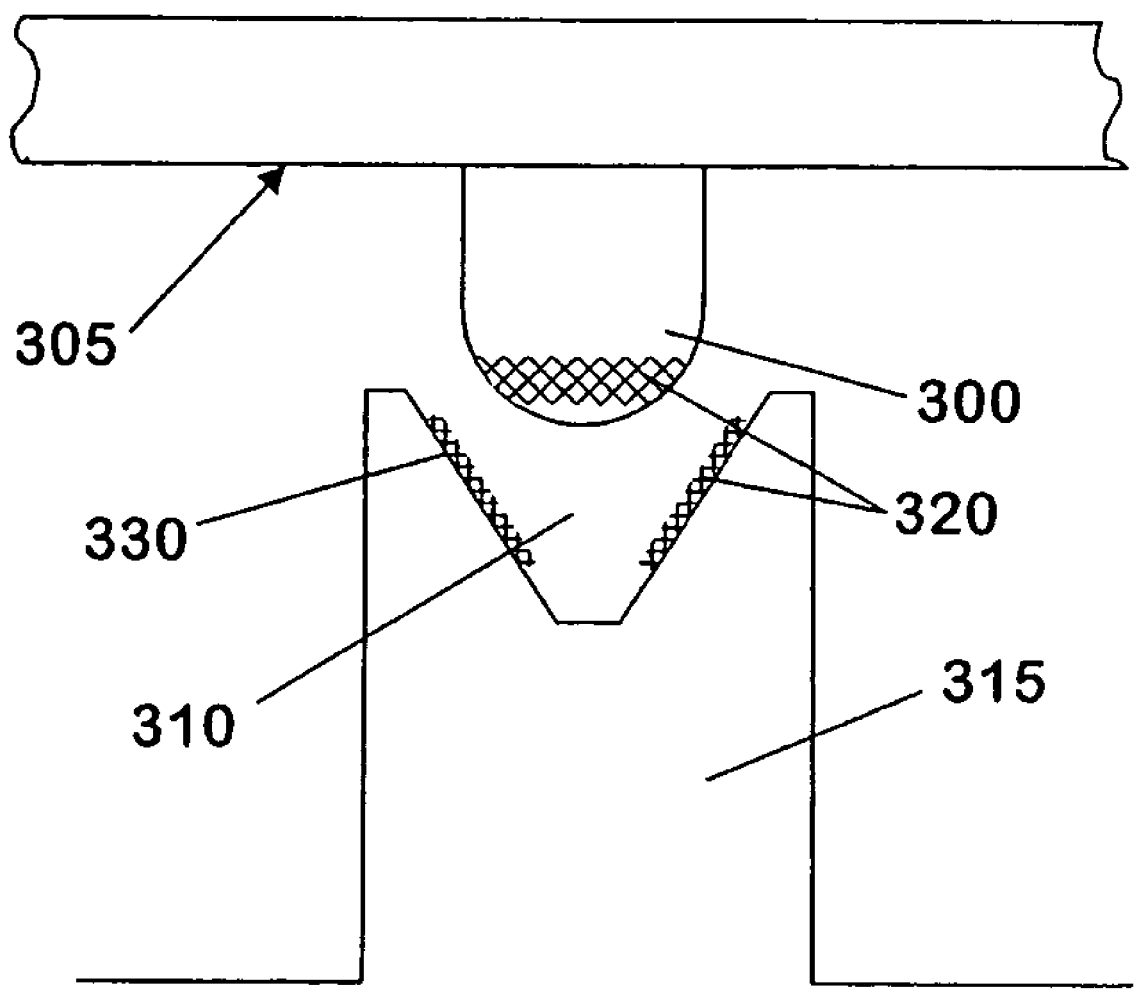
FIG. 12 depicts kinematic coupling members according to the present invention.

It is noted that the present invention is not limited to interface portions of concave shape. Referring to FIG. 12, a convex interface portion 300 may also be utilized. The convex interface portion 300 extends from an outer surface of a substrate carrier 305 and subsequently mates with a recess 310 located on the processing equipment 315. A textured contact surface 320 can be formed either on the convex interface portion 300 or on the contact surface 330 of the recess 310.

A criterion in selecting the material in the fabrication of the interface portions 40 or 300 is the hardness of the material. Harder materials tend exhibit lower friction properties. For injection molding, blow molding or extrusion processes, commonly selected materials include, but are in no way limited to, polycarbonate, polyetherimide, polyphenol sulphone, and other amorphous polymers. Additionally, such polymers may be annealed after formation to crystallize the polymer and creating a low friction skin. In an overmolding process, a common material is polyetheretherketone, which is known for its hardness and wear resistance.

While the present invention is directed primarily to kinematic couplings of substrate carriers, including, but not limited to the front opening unified pod (FOUP), the front opening shipping box (FOSB) and the front opening mechanical interface standard (FIMS) pod, the present invention is pertinent to the other equipment interfaces on substrate carriers, specifically, the key slots, robotic flanges, and side rails.

What is claimed is:

1. A substrate carrier comprising a container portion with bottom side and a kinematic coupling plate attached to said bottom side, the kinematic coupling plate comprising:
a base with three pairs of inclined contact surfaces defining three recesses for contacting three kinematic coupling pins, at least one of said contact surfaces having a three-dimensional pattern formed thereon to eliminate sticking with one of said kinematic coupling pins.

2. The substrate carrier of claim 1 wherein each pair of inclined surfaces has an aperture therebetween and wherein the container portion has three pairs of ribs extending therefrom exposed through the apertures for seating on the three kinematic coupling pins.

3. A substrate container for holding substrates for use in processing semiconductors, the substrate container comprising a carrier portion having a bottom side with three female kinematic coupling engagement portions thereon for engaging three male kinematic coupling projections, each of said three female kinematic coupling engagement portions having an exposed contact surface for engaging one of the three male kinematic coupling projections, each of said exposed surfaces having a three-dimensional profile formed thereon.

4. The substrate container of claim 3 wherein the three-dimensional profile of each of the exposed contact surfaces has a surface roughness of greater than 3 μm.

5. The substrate container of claim 3, wherein the container portion comprises a shell with a bottom side and an exposed kinematic coupling plate attached to the shell at the bottom side, and wherein each of said exposed contact surfaces are part of the exposed kinematic coupling plate.

6. The substrate container of claim 3, wherein said three-dimensional profile comprises a knurled pattern having a peak-to-valley depth of greater than 3 μm.

7. The substrate container of claim 3 wherein said three-dimensional profile comprises a series of parallel ridges having a peak-to-valley depth of greater than 3 μm.

8. The substrate container of claim 3 wherein said three-dimensional profile comprises an array of at least one of dimples and spheres having a peak-to-valley depth of greater than 3 μm.

9. The substrate container of claim 3 further comprising a door that latches to and closes said container portion.

10. A substrate carrier comprising three female kinematic coupling engagement portions, at least one of said female kinematic coupling engagement portions having a textured contact surface for engaging with a male kinematic coupling projection, said contact surface having at least a three-dimensional profile formed thereon, said profile having a peak-to-valley depth of at least 5 μm.

11. The substrate carrier of claim 10 wherein said three kinematic coupling female engagement portions are separably attached to said container portion.

12. The substrate carrier of claim 10 wherein said textured contact surface comprises a knurled pattern.

13. The substrate carrier of claim 10 wherein said each of said three female kinematic coupling engagement portions has a textured contact surface.

14. The substrate carrier of claim 10 wherein said textured contact surface comprises a series of parallel ridges.

15. The substrate carrier of claim 10 wherein said textured contact surface comprises an array of dimples or spheres.

16. The substrate carrier of claim 10 wherein said textured contact surface is on a separate piece insert molded into the substrate carrier.

* * * * *